United States Patent
Shu et al.

(10) Patent No.: US 10,958,272 B2
(45) Date of Patent: Mar. 23, 2021

(54) COMPUTATIONAL MEMORY CELL AND PROCESSING ARRAY DEVICE USING COMPLEMENTARY EXCLUSIVE OR MEMORY CELLS

(71) Applicant: GSI Technology, Inc., Sunnyvale, CA (US)

(72) Inventors: Lee-Lean Shu, Sunnyvale, CA (US); Avidan Akerib, Sunnyvale, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 0 days.

(21) Appl. No.: 16/444,837

(22) Filed: Jun. 18, 2019

(65) Prior Publication Data

US 2020/0403616 A1    Dec. 24, 2020

(51) Int. Cl.
| | | |
|---|---|---|
| *G11C 11/419* | (2006.01) | |
| *H03K 19/0948* | (2006.01) | |
| *G11C 11/418* | (2006.01) | |
| *H03K 19/21* | (2006.01) | |
| *H03K 19/20* | (2006.01) | |

(52) U.S. Cl.
CPC ........ *H03K 19/0948* (2013.01); *G11C 11/418* (2013.01); *G11C 11/419* (2013.01); *H03K 19/20* (2013.01); *H03K 19/215* (2013.01)

(58) Field of Classification Search
CPC . G11C 11/419; G11C 11/418; H03K 19/0948; H03K 19/20; H03K 19/215
See application file for complete search history.

(56) References Cited

U.S. PATENT DOCUMENTS

| | | | |
|---|---|---|---|
| 3,451,694 | A | 6/1969 | Hass |
| 3,747,952 | A | 7/1973 | Graebe |
| 3,795,412 | A | 3/1974 | John |
| 4,227,717 | A | 10/1980 | Bouvier |
| 4,308,505 | A | 12/1981 | Messerschmitt |
| 4,587,496 | A | 5/1986 | Wolaver |
| 4,594,564 | A | 6/1986 | Yarborough, Jr. |
| 4,677,394 | A | 6/1987 | Vollmer |
| 4,716,322 | A | 12/1987 | D'Arrigo et al. |
| 4,741,006 | A | 4/1988 | Yamaguchi et al. |
| 4,856,035 | A | 8/1989 | Lewis |
| 5,008,636 | A | 4/1991 | Markinson |
| 5,302,916 | A | 4/1994 | Pritchett |
| 5,375,089 | A | 12/1994 | Lo |
| 5,382,922 | A | 1/1995 | Gersbach |

(Continued)

FOREIGN PATENT DOCUMENTS

| | | |
|---|---|---|
| CN | 104752431 | 7/2015 |
| DE | 10133281 A1 | 1/2002 |
| JP | 2005-346922 | 12/2005 |

OTHER PUBLICATIONS

US 10,564,982 B1, 02/2020, Oh et al. (withdrawn)

(Continued)

*Primary Examiner* — Jay W. Radke
(74) *Attorney, Agent, or Firm* — DLA Piper LLP (US)

(57) ABSTRACT

A memory cell and processing array that has a plurality of memory are capable of performing logic functions, including an exclusive OR (XOR) or an exclusive NOR (XNOR) logic function. The memory cell may have a read port in which the digital data stored in the storage cell of the memory cell is isolated from the read bit line.

30 Claims, 11 Drawing Sheets

(56) References Cited

U.S. PATENT DOCUMENTS

| | | |
|---|---|---|
| 5,400,274 A | 3/1995 | Jones |
| 5,473,574 A | 12/1995 | Clemen et al. |
| 5,530,383 A | 6/1996 | May |
| 5,535,159 A | 7/1996 | Nii |
| 5,563,834 A | 10/1996 | Longway et al. |
| 5,587,672 A | 12/1996 | Ranganathan et al. |
| 5,608,354 A | 3/1997 | Hori |
| 5,661,419 A | 8/1997 | Bhagwan |
| 5,696,468 A | 12/1997 | Nise |
| 5,736,872 A | 4/1998 | Sharma et al. |
| 5,744,979 A | 4/1998 | Goetting |
| 5,744,991 A | 4/1998 | Jefferson et al. |
| 5,748,044 A | 5/1998 | Xue |
| 5,768,559 A | 6/1998 | Iino et al. |
| 5,805,912 A | 9/1998 | Johnson et al. |
| 5,883,853 A | 3/1999 | Zheng et al. |
| 5,937,204 A | 8/1999 | Schinnerer |
| 5,942,949 A | 8/1999 | Wilson et al. |
| 5,963,059 A | 10/1999 | Partovi et al. |
| 5,969,576 A | 10/1999 | Trodden |
| 5,969,986 A | 10/1999 | Wong |
| 5,977,801 A | 11/1999 | Boerstler |
| 5,999,458 A | 12/1999 | Nishimura et al. |
| 6,005,794 A | 12/1999 | Sheffield et al. |
| 6,044,034 A | 3/2000 | Katakura |
| 6,058,063 A | 5/2000 | Jang |
| 6,072,741 A | 6/2000 | Taylor |
| 6,100,721 A | 8/2000 | Durec et al. |
| 6,100,736 A | 8/2000 | Wu et al. |
| 6,114,920 A | 9/2000 | Moon et al. |
| 6,115,320 A | 9/2000 | Mick et al. |
| 6,133,770 A | 10/2000 | Hasegawa |
| 6,167,487 A | 12/2000 | Camacho |
| 6,175,282 B1 | 1/2001 | Yasuda |
| 6,226,217 B1 | 5/2001 | Riedlinger et al. |
| 6,262,937 B1 | 7/2001 | Arcoleo et al. |
| 6,263,452 B1 | 7/2001 | Jewett et al. |
| 6,265,902 B1 | 7/2001 | Klemmer et al. |
| 6,286,077 B1 | 9/2001 | Choi et al. |
| 6,310,880 B1 | 10/2001 | Waller |
| 6,366,524 B1 | 4/2002 | Abedifard |
| 6,377,127 B1 | 4/2002 | Fukaishi et al. |
| 6,381,684 B1 | 4/2002 | Hronik et al. |
| 6,385,122 B1 | 5/2002 | Chang |
| 6,407,642 B2 | 6/2002 | Dosho et al. |
| 6,418,077 B1 | 7/2002 | Naven |
| 6,441,691 B1 | 8/2002 | Jones et al. |
| 6,448,757 B2 | 9/2002 | Hill |
| 6,473,334 B1 | 10/2002 | Bailey et al. |
| 6,483,361 B1 | 11/2002 | Chiu |
| 6,504,417 B1 | 1/2003 | Cecchi et al. |
| 6,538,475 B1 | 3/2003 | Johansen et al. |
| 6,567,338 B1 | 5/2003 | Mick |
| 6,594,194 B2 | 7/2003 | Gold |
| 6,642,747 B1 | 11/2003 | Chiu |
| 6,661,267 B2 | 12/2003 | Walker et al. |
| 6,665,222 B2 | 12/2003 | Wright et al. |
| 6,683,502 B1 | 1/2004 | Groen et al. |
| 6,683,930 B1 | 1/2004 | Dalmia |
| 6,732,247 B2 | 5/2004 | Berg et al. |
| 6,744,277 B1 | 6/2004 | Chang et al. |
| 6,757,854 B1 | 6/2004 | Zhao |
| 6,789,209 B1 | 9/2004 | Suzuki et al. |
| 6,816,019 B2 | 11/2004 | Delbo' et al. |
| 6,836,419 B2 | 12/2004 | Loughmiller |
| 6,838,951 B1 | 1/2005 | Nieri et al. |
| 6,842,396 B2 | 1/2005 | Kono |
| 6,853,696 B1 | 2/2005 | Moser et al. |
| 6,854,059 B2 | 2/2005 | Gardner |
| 6,856,202 B2 | 2/2005 | Lesso |
| 6,859,107 B1 | 2/2005 | Moon et al. |
| 6,882,237 B2 | 4/2005 | Singh et al. |
| 6,897,696 B2 | 5/2005 | Chang et al. |
| 6,933,789 B2 | 8/2005 | Molnar et al. |
| 6,938,142 B2 | 8/2005 | Pawlowski |
| 6,940,328 B2 | 9/2005 | Lin |
| 6,954,091 B2 | 10/2005 | Wurzer |
| 6,975,554 B1 | 12/2005 | Lapidus et al. |
| 6,998,922 B2 | 2/2006 | Jensen et al. |
| 7,002,404 B2 | 2/2006 | Gaggl et al. |
| 7,002,416 B2 | 2/2006 | Pettersen et al. |
| 7,003,065 B2 | 2/2006 | Homol et al. |
| 7,017,090 B2 | 3/2006 | Endou et al. |
| 7,019,569 B2 | 3/2006 | Fan-Jiang |
| 7,042,271 B2 | 5/2006 | Chung et al. |
| 7,042,792 B2 | 5/2006 | Lee et al. |
| 7,042,793 B2 | 5/2006 | Masuo |
| 7,046,093 B1 | 5/2006 | McDonagh et al. |
| 7,047,146 B2 | 5/2006 | Chuang et al. |
| 7,053,666 B2 | 5/2006 | Tak et al. |
| 7,095,287 B2 | 8/2006 | Maxim et al. |
| 7,099,643 B2 | 8/2006 | Lin |
| 7,141,961 B2 | 11/2006 | Hirayama et al. |
| 7,142,477 B1 | 11/2006 | Tran et al. |
| 7,152,009 B2 | 12/2006 | Bokui et al. |
| 7,180,816 B2 | 2/2007 | Park |
| 7,200,713 B2 | 4/2007 | Cabot et al. |
| 7,218,157 B2 | 5/2007 | Van De Beek et al. |
| 7,233,214 B2 | 6/2007 | Kim et al. |
| 7,246,215 B2 | 7/2007 | Lu et al. |
| 7,263,152 B2 | 8/2007 | Miller et al. |
| 7,269,402 B2 | 9/2007 | Uozumi et al. |
| 7,282,999 B2 | 10/2007 | Da Dalt et al. |
| 7,312,629 B2 | 12/2007 | Chuang et al. |
| 7,313,040 B2 | 12/2007 | Chuang et al. |
| 7,330,080 B1 | 2/2008 | Stoiber et al. |
| 7,340,577 B1 | 3/2008 | Van Dyke et al. |
| 7,349,515 B1 | 3/2008 | Chew et al. |
| 7,352,249 B2 | 4/2008 | Balboni et al. |
| 7,355,482 B2 | 4/2008 | Meltzer |
| 7,355,907 B2 | 4/2008 | Chen et al. |
| 7,369,000 B2 | 5/2008 | Wu et al. |
| 7,375,593 B2 | 5/2008 | Self |
| 7,389,457 B2 | 6/2008 | Chen et al. |
| 7,439,816 B1 | 10/2008 | Lombaard |
| 7,463,101 B2 | 12/2008 | Tung |
| 7,464,282 B1 | 12/2008 | Abdollahi-Alibeik et al. |
| 7,487,315 B2 | 2/2009 | Hur et al. |
| 7,489,164 B2 | 2/2009 | Madurawe |
| 7,512,033 B2 | 3/2009 | Hur et al. |
| 7,516,385 B2 | 4/2009 | Chen et al. |
| 7,538,623 B2 | 5/2009 | Jensen et al. |
| 7,545,223 B2 | 6/2009 | Watanabe |
| 7,565,480 B2 | 7/2009 | Ware et al. |
| 7,577,225 B2 | 8/2009 | Azadet et al. |
| 7,592,847 B2 | 9/2009 | Liu et al. |
| 7,595,657 B2 | 9/2009 | Chuang et al. |
| 7,622,996 B2 | 11/2009 | Liu |
| 7,630,230 B2 | 12/2009 | Wong |
| 7,633,322 B1 | 12/2009 | Zhuang et al. |
| 7,635,988 B2 | 12/2009 | Madurawe |
| 7,646,215 B2 | 1/2010 | Chuang et al. |
| 7,646,648 B2 | 1/2010 | Arsovski |
| 7,659,783 B2 | 2/2010 | Tai |
| 7,660,149 B2 | 2/2010 | Liaw |
| 7,663,415 B2 | 2/2010 | Chatterjee et al. |
| 7,667,678 B2 | 2/2010 | Guttag |
| 7,675,331 B2 | 3/2010 | Jung et al. |
| 7,719,329 B1 | 5/2010 | Smith |
| 7,719,330 B2 | 5/2010 | Lin et al. |
| 7,728,675 B1 | 6/2010 | Kennedy et al. |
| 7,737,743 B1 | 6/2010 | Gao et al. |
| 7,746,181 B1 | 6/2010 | Moyal |
| 7,746,182 B2 | 6/2010 | Ramaswamy et al. |
| 7,750,683 B2 | 7/2010 | Huang et al. |
| 7,760,032 B2 | 7/2010 | Ardehali |
| 7,760,040 B2 | 7/2010 | Zhang et al. |
| 7,760,532 B2 | 7/2010 | Shirley et al. |
| 7,782,655 B2 | 8/2010 | Shau |
| 7,812,644 B2 | 10/2010 | Cha et al. |
| 7,830,212 B2 | 11/2010 | Lee et al. |
| 7,839,177 B1 | 11/2010 | Soh |
| 7,843,239 B2 | 11/2010 | Sohn et al. |
| 7,843,721 B1 | 11/2010 | Chou et al. |

(56) References Cited

U.S. PATENT DOCUMENTS

| | | |
|---|---|---|
| 7,848,725 B2 | 12/2010 | Zolfaghari et al. |
| 7,859,919 B2 | 12/2010 | De La Cruz, II et al. |
| 7,876,163 B2 | 1/2011 | Hachigo |
| 7,916,554 B2 | 3/2011 | Pawlowski |
| 7,920,409 B1 | 4/2011 | Clark |
| 7,920,665 B1 | 4/2011 | Lombaard |
| 7,924,599 B1 | 4/2011 | Evans, Jr. et al. |
| 7,940,088 B1 | 5/2011 | Sampath et al. |
| 7,944,256 B2 | 5/2011 | Masuda |
| 7,956,695 B1 | 6/2011 | Ding et al. |
| 7,965,108 B2 | 6/2011 | Liu et al. |
| 8,004,920 B2 | 8/2011 | Ito et al. |
| 8,008,956 B1 | 8/2011 | Shin et al. |
| 8,044,724 B2 | 10/2011 | Rao et al. |
| 8,063,707 B2 | 11/2011 | Wang |
| 8,087,690 B2 | 1/2012 | Kim |
| 8,089,819 B2 | 1/2012 | Noda |
| 8,117,567 B2 | 2/2012 | Arsovski |
| 8,174,332 B1 | 5/2012 | Lombaard et al. |
| 8,218,707 B2 | 7/2012 | Mai |
| 8,242,820 B2 | 8/2012 | Kim |
| 8,258,831 B1 | 9/2012 | Banai |
| 8,284,593 B2 | 10/2012 | Russell |
| 8,294,502 B2 | 10/2012 | Lewis et al. |
| 8,400,200 B1 | 3/2013 | Kim et al. |
| 8,488,408 B1 | 7/2013 | Shu et al. |
| 8,493,774 B2 | 7/2013 | Kung |
| 8,526,256 B2 | 9/2013 | Gosh |
| 8,542,050 B2 | 9/2013 | Chuang et al. |
| 8,575,982 B1 | 11/2013 | Shu et al. |
| 8,593,860 B2 | 11/2013 | Shu et al. |
| 8,625,334 B2 | 1/2014 | Liaw |
| 8,643,418 B2 | 2/2014 | Ma et al. |
| 8,692,621 B2 | 4/2014 | Snowden et al. |
| 8,693,236 B2 | 4/2014 | Shu |
| 8,817,550 B2 | 8/2014 | Oh |
| 8,837,207 B1 | 9/2014 | Jou |
| 8,885,439 B1 | 11/2014 | Shu et al. |
| 8,971,096 B2 | 3/2015 | Jung et al. |
| 8,995,162 B2 | 3/2015 | Sang et al. |
| 9,018,992 B1 | 4/2015 | Shu et al. |
| 9,030,893 B2 | 5/2015 | Jung |
| 9,053,768 B2 | 6/2015 | Shu et al. |
| 9,059,691 B2 | 6/2015 | Lin |
| 9,070,477 B1 | 6/2015 | Clark |
| 9,083,356 B1 | 7/2015 | Cheng |
| 9,093,135 B2 | 7/2015 | Khailany |
| 9,094,025 B1 | 7/2015 | Cheng |
| 9,135,986 B2 | 9/2015 | Shu |
| 9,142,285 B2 | 9/2015 | Hwang et al. |
| 9,159,391 B1 | 10/2015 | Shu et al. |
| 9,171,634 B2 | 10/2015 | Bo |
| 9,177,646 B2 | 11/2015 | Arsovski |
| 9,196,324 B2 | 11/2015 | Haig et al. |
| 9,240,229 B1 | 1/2016 | Oh et al. |
| 9,311,971 B1 | 4/2016 | Oh |
| 9,318,174 B1 | 4/2016 | Chuang et al. |
| 9,356,611 B1 | 5/2016 | Shu et al. |
| 9,384,822 B2 | 7/2016 | Shu et al. |
| 9,385,032 B2 | 7/2016 | Shu |
| 9,396,790 B1 | 7/2016 | Chhabra |
| 9,396,795 B1 | 7/2016 | Jeloka et al. |
| 9,401,200 B1 | 7/2016 | Chan |
| 9,412,440 B1 | 8/2016 | Shu et al. |
| 9,413,295 B1 | 8/2016 | Chang |
| 9,431,079 B1 | 8/2016 | Shu et al. |
| 9,443,575 B2 | 9/2016 | Yabuuchi |
| 9,484,076 B1 | 11/2016 | Shu et al. |
| 9,494,647 B1 | 11/2016 | Chuang et al. |
| 9,552,872 B2 | 1/2017 | Jung |
| 9,608,651 B1 | 3/2017 | Cheng |
| 9,613,670 B2 | 4/2017 | Chuang et al. |
| 9,613,684 B2 | 4/2017 | Shu et al. |
| 9,640,540 B1 | 5/2017 | Liaw |
| 9,679,631 B2 | 6/2017 | Haig et al. |
| 9,685,210 B1 | 6/2017 | Ghosh et al. |
| 9,692,429 B1 | 6/2017 | Chang |
| 9,697,890 B1 | 7/2017 | Wang |
| 9,722,618 B1 | 8/2017 | Cheng |
| 9,729,159 B1 | 8/2017 | Cheng |
| 9,789,840 B2 | 10/2017 | Farooq |
| 9,804,856 B2 | 10/2017 | Oh et al. |
| 9,847,111 B2 | 12/2017 | Shu et al. |
| 9,853,633 B1 | 12/2017 | Cheng et al. |
| 9,853,634 B2 | 12/2017 | Chang |
| 9,859,902 B2 | 1/2018 | Chang |
| 9,916,889 B1 | 3/2018 | Duong |
| 9,935,635 B2 | 4/2018 | Kim et al. |
| 9,966,118 B2 | 5/2018 | Shu et al. |
| 10,065,594 B2 | 9/2018 | Fukawatase |
| 10,153,042 B2 | 12/2018 | Ehrman |
| 10,192,592 B2 | 1/2019 | Shu et al. |
| 10,249,312 B2 | 4/2019 | Kim et al. |
| 10,249,362 B2 | 4/2019 | Shu et al. |
| 10,388,364 B2 | 8/2019 | Ishizu et al. |
| 10,425,070 B2 | 9/2019 | Cheng et al. |
| 10,521,229 B2 | 12/2019 | Shu et al. |
| 10,535,381 B2 | 1/2020 | Shu et al. |
| 10,659,058 B1 | 5/2020 | Cheng et al. |
| 10,673,440 B1 | 6/2020 | Camarota |
| 10,725,777 B2 * | 7/2020 | Shu ............... G11C 11/418 |
| 10,770,133 B1 | 9/2020 | Haig et al. |
| 10,777,262 B1 | 9/2020 | Haig et al. |
| 10,847,212 B1 | 11/2020 | Haig et al. |
| 10,847,213 B1 | 11/2020 | Haig et al. |
| 10,854,284 B1 | 12/2020 | Chuang et al. |
| 10,860,320 B1 | 12/2020 | Haig et al. |
| 10,877,731 B1 | 12/2020 | Shu et al. |
| 10,891,076 B1 | 1/2021 | Haig et al. |
| 2001/0052822 A1 | 12/2001 | Kim et al. |
| 2002/0006072 A1 | 1/2002 | Kunikiyo |
| 2002/0060938 A1 | 5/2002 | Song |
| 2002/0136074 A1 | 9/2002 | Hanzawa et al. |
| 2002/0154565 A1 | 10/2002 | Noh et al. |
| 2002/0168935 A1 | 11/2002 | Han |
| 2003/0016689 A1 | 1/2003 | Hoof |
| 2003/0107913 A1 | 6/2003 | Nii |
| 2003/0185329 A1 | 10/2003 | Dickmann |
| 2004/0053510 A1 | 3/2004 | Little |
| 2004/0062138 A1 | 4/2004 | Partsch et al. |
| 2004/0090413 A1 | 5/2004 | Yoo |
| 2004/0160250 A1 | 8/2004 | Kim et al. |
| 2004/0169565 A1 | 9/2004 | Gaggl et al. |
| 2004/0199803 A1 | 10/2004 | Suzuki et al. |
| 2004/0240301 A1 | 12/2004 | Rao |
| 2004/0264279 A1 | 12/2004 | Wordeman |
| 2004/0264286 A1 | 12/2004 | Ware et al. |
| 2005/0024912 A1 | 2/2005 | Chen et al. |
| 2005/0026329 A1 | 2/2005 | Kim et al. |
| 2005/0036394 A1 | 2/2005 | Shiraishi |
| 2005/0186930 A1 | 8/2005 | Rofougaran et al. |
| 2005/0226079 A1 | 10/2005 | Zhu et al. |
| 2005/0226357 A1 | 10/2005 | Yoshimura |
| 2005/0253658 A1 | 11/2005 | Maeda et al. |
| 2005/0285862 A1 | 12/2005 | Noda |
| 2006/0039227 A1 | 2/2006 | Lai et al. |
| 2006/0055434 A1 | 3/2006 | Tak et al. |
| 2006/0119443 A1 | 6/2006 | Azam et al. |
| 2006/0139105 A1 | 6/2006 | Maxim et al. |
| 2006/0143428 A1 | 6/2006 | Noda |
| 2006/0248305 A1 | 11/2006 | Fang |
| 2007/0001721 A1 | 1/2007 | Chen et al. |
| 2007/0047283 A1 | 3/2007 | Miyanishi |
| 2007/0058407 A1 | 3/2007 | Dosaka et al. |
| 2007/0109030 A1 | 5/2007 | Park |
| 2007/0115739 A1 | 5/2007 | Huang |
| 2007/0139997 A1 | 6/2007 | Suzuki |
| 2007/0171713 A1 | 7/2007 | Hunter |
| 2007/0189101 A1 | 8/2007 | Lambrache et al. |
| 2007/0229129 A1 | 10/2007 | Nakagawa |
| 2008/0010429 A1 | 1/2008 | Rao |
| 2008/0049484 A1 | 2/2008 | Sasaki |
| 2008/0068096 A1 | 3/2008 | Feng et al. |
| 2008/0079467 A1 | 4/2008 | Hou et al. |

(56) References Cited

U.S. PATENT DOCUMENTS

| | | |
|---|---|---|
| 2008/0080230 A1 | 4/2008 | Liaw |
| 2008/0117707 A1 | 5/2008 | Manickavasakam |
| 2008/0129402 A1 | 6/2008 | Han et al. |
| 2008/0155362 A1 | 6/2008 | Chang et al. |
| 2008/0175039 A1 | 7/2008 | Thomas |
| 2008/0181029 A1 | 7/2008 | Joshi et al. |
| 2008/0265957 A1 | 10/2008 | Luong et al. |
| 2008/0273361 A1 | 11/2008 | Dudeck et al. |
| 2009/0027947 A1 | 1/2009 | Takeda |
| 2009/0089646 A1 | 4/2009 | Hirose |
| 2009/0141566 A1 | 6/2009 | Arsovski |
| 2009/0154257 A1 | 6/2009 | Fujioka et al. |
| 2009/0161468 A1 | 6/2009 | Fujioka |
| 2009/0231943 A1 | 9/2009 | Kunce et al. |
| 2009/0256642 A1 | 10/2009 | Lesso |
| 2009/0296869 A1 | 12/2009 | Chao et al. |
| 2009/0319871 A1 | 12/2009 | Shirai et al. |
| 2010/0020590 A1 | 1/2010 | Hsueh et al. |
| 2010/0085086 A1 | 4/2010 | Nedovic et al. |
| 2010/0157715 A1 | 6/2010 | Pyeon |
| 2010/0169675 A1 | 7/2010 | Kajihara |
| 2010/0172190 A1 | 7/2010 | Lavi |
| 2010/0177571 A1 | 7/2010 | Shori et al. |
| 2010/0214815 A1 | 8/2010 | Tam |
| 2010/0232202 A1 | 9/2010 | Lu |
| 2010/0260001 A1 | 10/2010 | Kasprak et al. |
| 2010/0271138 A1 | 10/2010 | Thakur et al. |
| 2010/0322022 A1 | 12/2010 | Shinozaki et al. |
| 2011/0018597 A1 | 1/2011 | Lee et al. |
| 2011/0063898 A1 | 3/2011 | Ong |
| 2011/0153932 A1 | 6/2011 | Ware et al. |
| 2011/0211401 A1 | 9/2011 | Chan et al. |
| 2011/0267914 A1 | 11/2011 | Ish Iku Ra |
| 2011/0280307 A1 | 11/2011 | Macinnis et al. |
| 2011/0292743 A1 | 12/2011 | Zimmerman |
| 2011/0299353 A1 | 12/2011 | Ito et al. |
| 2012/0049911 A1 | 3/2012 | Ura |
| 2012/0133114 A1 | 5/2012 | Choi |
| 2012/0153999 A1 | 6/2012 | Kim |
| 2012/0242382 A1 | 9/2012 | Tsuchiya et al. |
| 2012/0243347 A1 | 9/2012 | Sampigethaya |
| 2012/0250440 A1 | 10/2012 | Wu |
| 2012/0281459 A1 | 11/2012 | Teman et al. |
| 2012/0327704 A1 | 12/2012 | Chan |
| 2013/0039131 A1 | 2/2013 | Haig et al. |
| 2013/0083591 A1 | 4/2013 | Wuu |
| 2013/0170289 A1 | 7/2013 | Grover et al. |
| 2014/0056093 A1 | 2/2014 | Tran et al. |
| 2014/0125390 A1 | 5/2014 | Ma |
| 2014/0136778 A1 | 5/2014 | Khailany et al. |
| 2014/0185366 A1 | 7/2014 | Chandwani et al. |
| 2014/0269019 A1 | 9/2014 | Kolar |
| 2015/0003148 A1 | 1/2015 | Iyer et al. |
| 2015/0029782 A1 | 1/2015 | Jung |
| 2015/0063052 A1 | 3/2015 | Manning |
| 2015/0187763 A1 | 7/2015 | Kim et al. |
| 2015/0213858 A1 | 7/2015 | Tao |
| 2015/0248927 A1 | 9/2015 | Fujiwara |
| 2015/0279453 A1 | 10/2015 | Fujiwara |
| 2015/0302917 A1 | 10/2015 | Grover |
| 2015/0310901 A1 | 10/2015 | Jung |
| 2015/0357028 A1 | 12/2015 | Huang et al. |
| 2016/0005458 A1 | 1/2016 | Shu et al. |
| 2016/0027500 A1 | 1/2016 | Chuang et al. |
| 2016/0064068 A1 | 3/2016 | Mojumder |
| 2016/0141023 A1 | 5/2016 | Jung |
| 2016/0225436 A1 | 8/2016 | Wang |
| 2016/0225437 A1 | 8/2016 | Kumar |
| 2016/0247559 A1 | 8/2016 | Atallah et al. |
| 2016/0329092 A1 | 11/2016 | Akerib |
| 2017/0194046 A1 | 7/2017 | Yeung, Jr. et al. |
| 2017/0345505 A1 | 11/2017 | Noel et al. |
| 2018/0122456 A1 | 5/2018 | Li |
| 2018/0123603 A1 | 5/2018 | Chang |
| 2018/0157621 A1 | 6/2018 | Shu et al. |
| 2018/0158517 A1 | 6/2018 | Shu et al. |
| 2018/0158518 A1 | 6/2018 | Shu et al. |
| 2018/0158519 A1 | 6/2018 | Shu et al. |
| 2018/0158520 A1* | 6/2018 | Shu ................ G11C 7/18 |
| 2020/0117398 A1* | 4/2020 | Haig ................ G11C 7/18 |
| 2020/0160905 A1* | 5/2020 | Charles ............ G11C 11/005 |
| 2020/0301707 A1 | 9/2020 | Shu et al. |

OTHER PUBLICATIONS

Wang et al., "A Two-Write and Two-Read Multi-Port SRAM with Shared Write Bit-Line Scheme and Selective Read Path for Low Power Operation", Journal of Low Power Electronics vol. 9. Sep. 22, 2013, Department of Electronics Engineering and Institute of Electronics, National Chiao-Tung University, Hsinchu 300, Taiwan (Accepted: Feb. 11, 2013), 14 pages.

* cited by examiner

| WE | WBL | WBLb | D(n) |
|---|---|---|---|
| 0 | x | x | D(n-1) |
| 1 | 0 | 1 | 0 |
| 1 | 1 | 0 | 1 |
| 1 | 0 | 0 | D(n-1) |

D(n) is storage data on the current write cycle
D(n-1) is storage data before the current write cycle

| State | IN | | | | OUT | | |
|---|---|---|---|---|---|---|---|
| | Ain | Bin | Cin | Cinb | Bout | Cout | Coutb |
| 1 | 0 | 0 | 0 | 1 | 0 | 0 | 1 |
| 2 | 0 | 0 | 1 | 0 | 1 | 0 | 1 |
| 3 | 0 | 1 | 0 | 1 | 1 | 0 | 1 |
| 4 | 0 | 1 | 1 | 0 | 0 | 1 | 0 |
| 5 | 1 | 0 | 0 | 1 | 1 | 0 | 1 |
| 6 | 1 | 0 | 1 | 0 | 0 | 1 | 0 |
| 7 | 1 | 1 | 0 | 1 | 0 | 1 | 0 |
| 8 | 1 | 1 | 1 | 0 | 1 | 1 | 0 |

Figure 5

| State | IN | | | OUT | |
|---|---|---|---|---|---|
| | Ain | Bin | Cinb | Bout | Coutb |
| 2 | 0 | 0 | 0 | 1 | 1 |
| 4 | 0 | 1 | 0 | 0 | 0 |
| 5 | 1 | 0 | 1 | 1 | 1 |
| 7 | 1 | 1 | 1 | 0 | 0 |

COMPUTATIONAL MEMORY CELL AND PROCESSING ARRAY DEVICE USING COMPLEMENTARY EXCLUSIVE OR MEMORY CELLS

FIELD

The disclosure relates generally to a static random access memory cell that may be used for computations.

BACKGROUND

An array of memory cells, such as dynamic random access memory (DRAM) cells, static random access memory (SRAM) cells, content addressable memory (CAM) cells or non-volatile memory cells, is a well-known mechanism used in various computer or processor based devices to store digital bits of data. The various computer and processor based devices may include computer systems, smartphone devices, consumer electronic products, televisions, internet switches and routers and the like. The array of memory cells are typically packaged in an integrated circuit or may be packaged within an integrated circuit that also has a processing device within the integrated circuit. The different types of typical memory cells have different capabilities and characteristics that distinguish each type of memory cell. For example, DRAM cells take longer to access, lose their data contents unless periodically refreshed, but are relatively cheap to manufacture due to the simple structure of each DRAM cell. SRAM cells, on the other hand, have faster access times, do not lose their data content unless power is removed from the SRAM cell and are relatively more expensive since each SRAM cell is more complicated than a DRAM cell. CAM cells have a unique function of being able to address content easily within the cells and are more expensive to manufacture since each CAM cell requires more circuitry to achieve the content addressing functionality.

Various computation devices that may be used to perform computations on digital, binary data are also well-known. The computation devices may include a microprocessor, a CPU, a microcontroller and the like. These computation devices are typically manufactured on an integrated circuit, but may also be manufactured on an integrated circuit that also has some amount of memory integrated onto the integrated circuit. In these known integrated circuits with a computation device and memory, the computation device performs the computation of the digital binary data bits while the memory is used to store various digital binary data including, for example, the instructions being executed by the computation device and the data being operated on by the computation device.

More recently, devices have been introduced that use memory arrays or storage cells to perform computation operations. In some of these devices, a processor array to perform computations may be formed from memory cells. These devices may be known as in-memory computational devices.

Big data operations are data processing operations in which a large amount of data must be processed. Machine learning uses artificial intelligence algorithms to analyze data and typically require a lot of data to perform. The big data operations and machine learning also are typically very computationally intensive applications that often encounter input/output issues due to a bandwidth bottleneck between the computational device and the memory that stores the data. The above in-memory computational devices may be used, for example, for these big data operations and machine learning applications since the in-memory computational devices perform the computations within the memory thereby eliminating the bandwidth bottleneck.

An SRAM cell can be configured to perform basic Boolean operations such as AND, OR, NAND and NOR. This SRAM cell can also support a Selective Write operation. However, this SRAM cell cannot perform certain logic functions that may be desirable. For example, it is desirable to be able to implement an exclusive OR (XOR) logic function since the XOR logic function is frequently used in a search operation when the search key needs to be compared to the contents in storage.

One of the most basic operations of a graphics processing unit (GPU) is a floating point calculation. The floating point calculation may be performed by well-known full adder circuitry. In a system described in co-pending and commonly owned U.S. patent application Ser. No. 15/708,181, filed on Sep. 19, 2017, the full adder may be performed in 4 clock cycles. However, it is desirable to be able to perform the full adder in a single clock cycle and it is to this end that the disclosure is directed.

BRIEF DESCRIPTION OF THE DRAWINGS

FIG. 3 illustrates a selective write truth table for the complementary XOR 3-port SRAM cell of FIG. 1;

FIGS. 4 and 5 illustrate a full adder truth table for a full adder that may be implemented using the processing array with complementary XOR cells shown in FIG. 2;

DETAILED DESCRIPTION OF ONE OR MORE EMBODIMENTS

The disclosure is particularly applicable to a CMOS implemented memory cell and processing array with a plurality of the memory cells that are capable two logic computations that may be used to perform a full adder operation in a single clock cycle and it is in this context that the disclosure will be described. It will be appreciated, however, that the memory cell and processing array has greater utility and is not limited to the below disclosed implementations since the memory cell may be constructed using different processes and may have different circuit configurations than those disclosed below that perform the two computations and so are within the scope of this disclosure. For purposes of illustration, a 3-port SRAM complementary XOR cell is disclosed below and in the figures. However, it is understood that the SRAM computation cell and processing array may also be implemented with an SRAM cell having three or more ports and the disclosure is not limited to the 3-port SRAM cell disclosed below. It is also understood that the SRAM cell having three or more ports may be slightly differently constructed than the 3-port SRAM shown in the figures, but one skilled in the art would understand how to construct those three or more port SRAMs for the disclosure below.

Furthermore, although an SRAM cell is used in the examples below, it is understood that the disclosed memory cell for computation and the processing array using the memory cells may be implemented using various different types of memory cells including the DRAMs, CAMs, non-volatile memory cells and non-volatile memory devices and these implementations using the various types of memory cells are within the scope of the disclosure.

Figure 1:
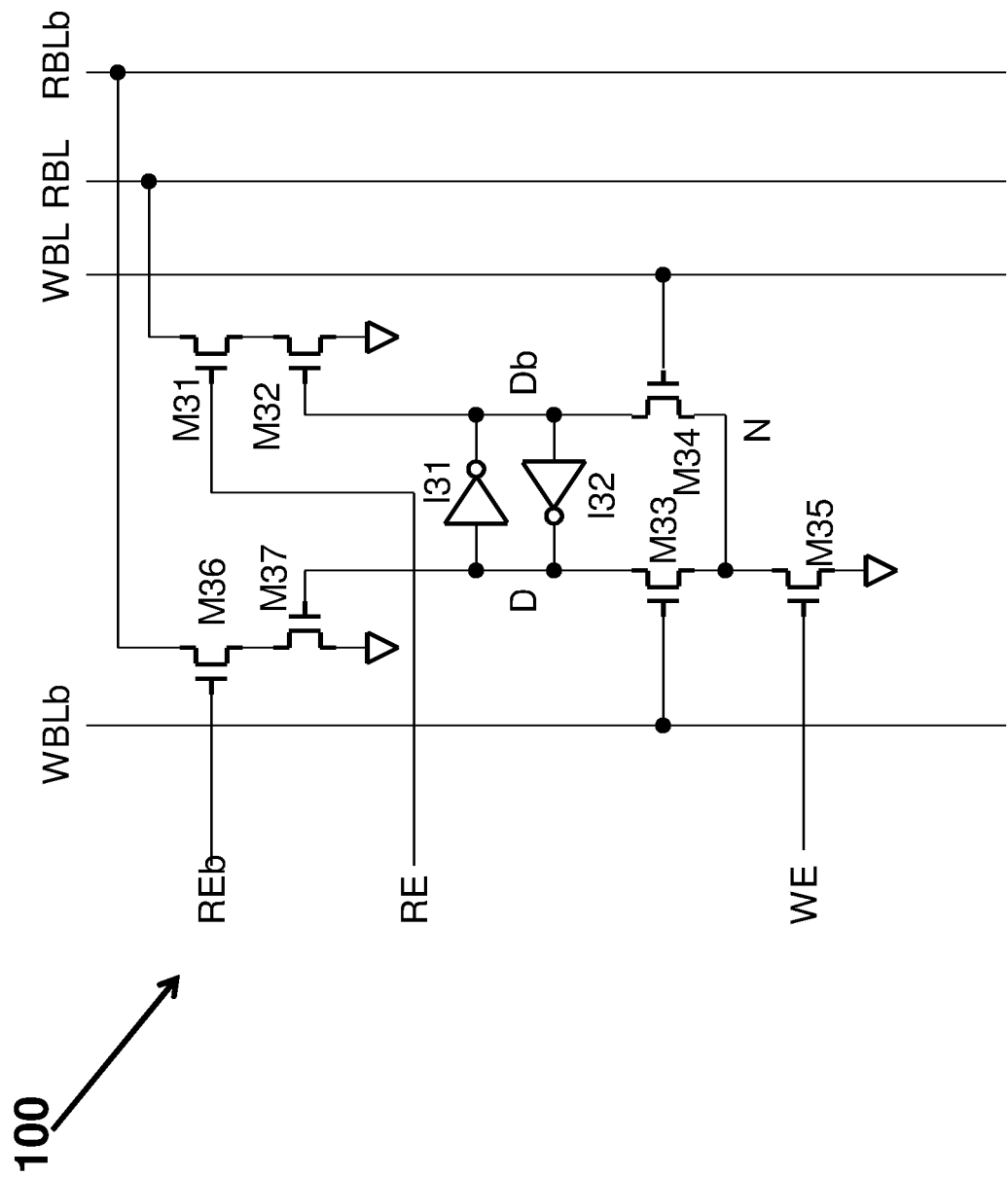
FIG. 1 illustrates an implementation of a complementary XOR cell with two read bit lines.

FIG. 1 illustrates an implementation of a 3-port SRAM complementary XOR cell 100 that may have two read bit lines and generate two logical computations each clock cycle. The 3-port SRAM cell 100 may include two cross coupled inverters 131, 132 and access transistors M31-M37 that are coupled together as shown in FIG. 1 to form the basic SRAM cell. The SRAM cell may be operated as a storage latch and may have 2 read ports (including the two read bit lines and transistors M31, M32, M36, M37) and a write port (including the write bit lines and transistors M33, M34, M35) to form a 3-port SRAM. The two inverters 131, 132 are cross coupled since the input of the first inverter is connected to the output of the second inverter (labeled D) and the output of the first inverter (labeled Db) is coupled to the input of the second inverter as shown in FIG. 1. The cross coupled inverters 131, 132 form the latch of the SRAM cell. The transistors M34 and M33 may have their respective gates connected to a write bit line and its complement bit line (WBL, WBLb), respectively. A write word line carries a signal WE. The write word line WE is coupled to the gate of a transistor M35 that is part of the write access circuitry for the SRAM cell.

The circuit in FIG. 1 may also have a read word line RE, a complementary read word line REb, a read bit line RBL, a complementary read bit line RBLb and a read port formed by transistors M31, M32 coupled together and another read port formed by transistors M36, M37 coupled together. The read word line RE may be coupled to the gate of transistor M31 that forms one read port, the read bit line RBL is coupled to the drain terminal of transistor M31 to perform a first computation during each clock cycle. The read word line complimentary REb may be coupled to the gate of transistor M36 that forms another read port, the read bit line RBLb is coupled to the drain terminal of transistor M36 to perform a second computation during each clock cycle. The gates of transistor M32 and M37 may be coupled to the Db and D outputs from the cross coupled inverters 131, 132, respectively. An isolation circuit (transistors M31, M32 and M36, M37 shown in FIG. 1) each isolates the latch outputs Db and D (in the example in FIG. 1) from the signal/voltage level of RBL and RBLb so that the Db and D signals are not susceptible to the lower bit line level caused by multiple "0" data stored in multiple cells in contrast to the typical SRAM cell.

The cell 100 shown in FIG. 1 has the two read bit lines, RBL and RBLb. The two read bit lines allow two computations (one computation using each read bit line) to be performed each clock cycle. This cell 100 in the processing array 200 shown in FIG. 2 permits the faster calculation of a floating point calculation. For example, the processing array 200 with a plurality of cells 100 can perform full adder operation in a single clock cycle.

When the read ports of cell 100 are active, it may operate such that either RE or REb is high and the REb signal/voltage level is the complement of RE signal/voltage level. It may also operate such that RE or REb signal/voltage levels both high or both low. RBL is pre-charged high, and if the transistor pair M31, M32 are both turned on, RBL is discharged to 0. If either one of M31, M32 transistors is off, then RBL stay high as 1 since it was precharged high and not coupled to ground. RBLb is also pre-charged high, and if the transistor pair M36, M37 are both turned on, RBLb is discharged to 0. If either one of M36, M37 transistors is off, then RBLb stay high as 1 since it was precharged high and not coupled to ground. The cell 100 may operate as a 3-port SRAM cell. The write operation is activated by WE and the data is written by toggling of WBL and WBLb. The read operation is activated by RE and REb, the read data is accessed on RBL or RBLb. The cell 100 may further be used for computation where RBL and RBLb are also used for logic operation.

Figure 2:
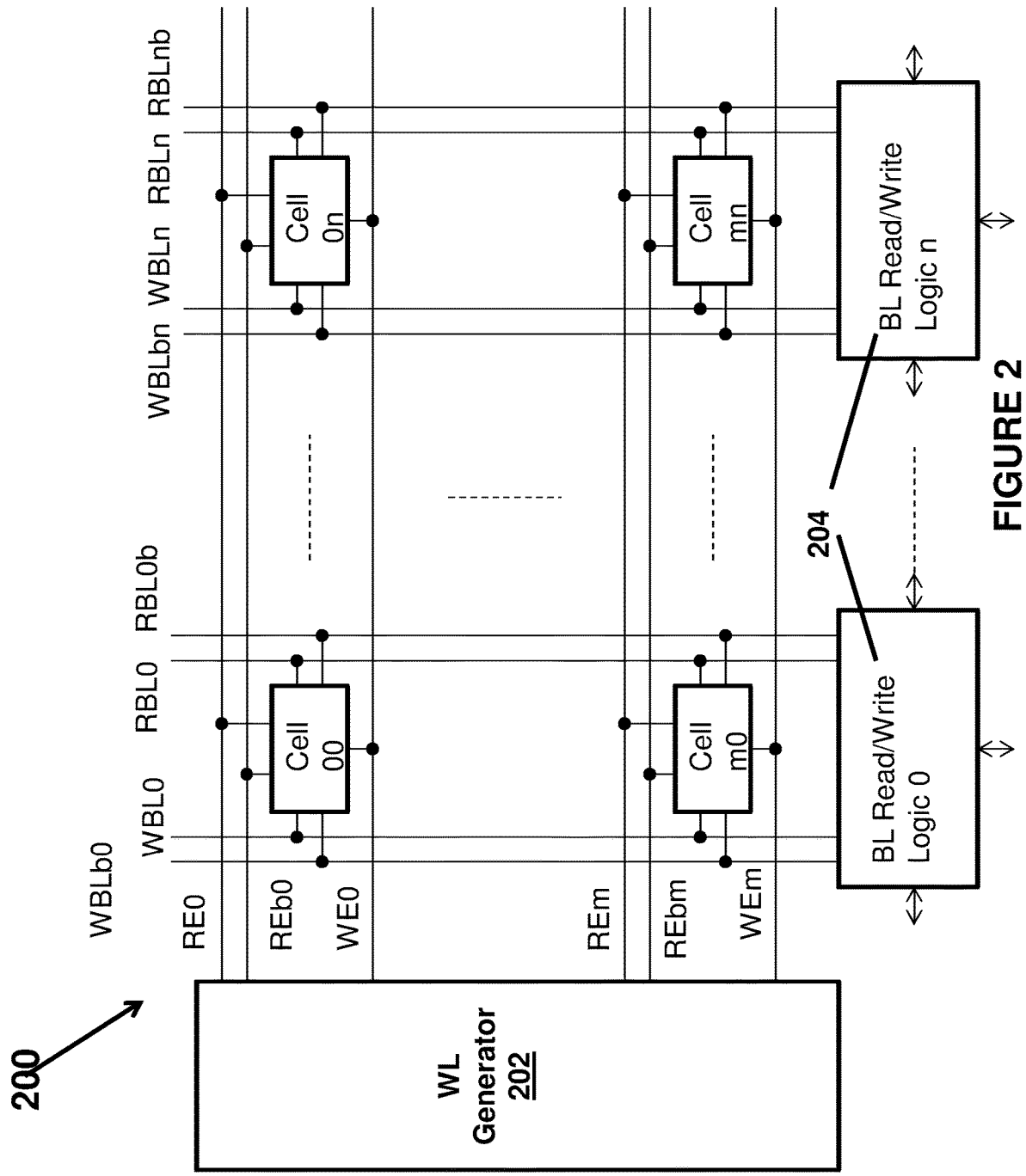
FIG. 2 illustrates an implementation of a first embodiment of a processing array that has a plurality of the complementary XOR cells shown in FIG. 1.

FIG. 2 illustrates an implementation of a processing array 200 that has a plurality of the SRAM cells shown in FIG. 1 (cell 00, . . . , cell 0n and cell m0, . . . , cell mn formed in an array) that can perform two computations using the two read bit lines. The array shown is formed by M word lines (RE0, REb0, WE0, . . . , REm, REbm, WEm) and N bit lines (WBLb0, WBL0, RBL0, RBL0b . . . , WBLbn, WBLn, RBLn, RBLnb). The processing array 200 may have a word line generator 202 that generates the word line signals/voltage levels and a plurality of bit line read/write logic circuits (BL Read/Write Logic 0, . . . , BL Read/Write Logic n) 204 that receive and process the bit line signals to generate the results of the two Boolean logic function/computations performed in each clock cycle. In each clock cycle, the processing array 200 may have both read and write operations, or either read or write operation, or not to have either operation, subjective to the activation of RE, REb and WE and the operation of BL Read/Write Logic. The disclosures of the BL Read/Write Logic below only illustrate the read and write operations operated in sequence. However, the read bit lines and write bit lines are separated, the processing array 200 of the 3-port SRAM cell 100 may operate the read and write operations at the same time, the disclosures are not limited to the read and write operations operated in sequence.

In a read operation, WL generator 202 generates one or multiple RE or REb signals in a cycle and RBL and/or RBLb form Boolean functions as described above whose results are sensed/read by the BL Read/Write Logic 204. The BL Read/Write Logic 204 processes the RBL and RBLb results and sends the results back to its WBL/WBLb for writing/using in that cell, or to the neighboring BL Read/Write Logic for writing/using in that neighboring cell, or send it out of this processing array. Alternatively, the BL Read/Write logic 204 can store RBL result and/or RBLb result from its own bit line or from the neighboring bit line in a register or latch so that the next cycle Read/Write logic can perform logic with the latched RBL and/or RBLb result data.

In a write operation, the WL generator 202 generates one or more WE signals for the cells to be written and the BL Read/Write Logic 204 processes the write data, either from its own RBL or RBLb line, or from the neighboring RBL or RBLb line or from out of this processing array. The ability of BL Read/Write Logic 204 to process the data from the neighboring bit lines means that the data can be shifting from one bit line to the neighboring bit line and one or more or all bit lines in the processing array may be shifting concurrently. The BL Read/Write Logic 204 can also decide not to write for a Selective Write operation based on RBL result and/or RBLb result. For example, WBL can be written to a data if RBL=1. If RBL=0, then a write is not performed.

Each BL Read/Write Logic 204 may have one or more Boolean logic circuits that perform various Boolean operations using the read bit lines as inputs. For example, each BL Read/Write Logic 204 may include one or more of AND circuitry and OR circuitry that may be implemented in various known manners and the disclosure is not limited to the particular implementation of the AND circuitry and OR circuitry in the BL Read/Write Logic 204.

Using the cell 100 in FIG. 1 and the processing array 200 shown in FIG. 2, the computation performed may be written as:

$$RBL=AND(D1,D2,Dn) \quad (EQ1)$$

where D1, D2, Dn are "n" number of data stored in the cells within a column of cells with the RE signal on/active $$RBLb=AND(Dbi1,Dbi2,Dbin) \quad (EQ2)$$

where Dbi1, Dbi2, Dbin are "n" number of data stored in the cells within a column of cells with the REb signal on/active $$RBLb=NOR(Di1,Di2,\ldots,Din) \quad (EQ3)$$

where Di1, Di2, ... Din are "n" number of data stored in the cells within a column of cells with the REb signal on/active The RE and REb signals of the cell can be both on, one on and one off, or both off. Therefore, Dm and Dbim, where m=1 to n in EQ1 and EQ2 may or may not be the true and complement data of the same cell.

In BL Read Write Logic 204, an AND gate can form the equation as:

$$Y1=AND(RBL,RBLb), \text{ then}$$

$$Y1=AND(D1,D2,\ldots,Dn,Dbi1,Dbi2,\ldots Dbim) \quad (EQ4)$$

where D1, D2, ... Dn are "n" numbers of data stored in the cells with RE on and Dbi1, Dbi2, ... Dbim are "m" number of data stored in the cells with REb on.

If RE and REb of the same cell are complementary signals, meaning they are not on at the same time, then Y1 is behaving as if RBL and RBLb are connected together and can be shown as $$Y1=AND(XNOR(RE1,D1),XNOR(RE2,\\D2),\ldots,XNOR(REn,Dn)) \quad (EQ5)$$

Alternatively, if RBL and RBL are connected together either through connecting MOS transistors, or through hard wired, we can also achieve Y1 of EQ5.

Y1 performs the same as the RBL line of the XOR cell (disclosed in U.S. patent application Ser. No. 15/709,399, filed Sep. 19, 2017 that is incorporated herein by reference) and details about the calculation of Y1 occur in same manner as previously disclosed and will not be described further here.

In BL Read Write Logic 204, an OR gate can form the equation as $$Y2=OR(RBL,RBLb), \text{ then}$$

$$Y2=OR(AND(D1,D2,\ldots,Dn),AND(Dbi1,\\Dbi2,\ldots,Dbin)) \quad (EQ6)$$

where cell x or ix can be the same cell. In other words, a cell's RE and REb can be turned on at the same time.

If RE and REb of cell 1 and 2 are on, then Y2 can be expressed as $$Y2=OR(AND(D1,D2),AND(Db1,Db2))=XNOR(D1,\\D2) \quad (EQ7)$$

Y2 performs Exclusive NOR function of cell 1 and 2 on the same bit line.

FIG. 3 illustrates a write port truth table for the 3-port SRAM cell of FIG. 1. If WE is 0, no write is performed (as reflected by the D(n−1) shown in FIG. 3). If WE is 1, then the storage nodes D and its complement Db are written by WBL and WBLb. D=1 and Db=0 if WBL=1 and WBLb=0. D=0 and Db=1 if WBL=0 and WBLb=1. If both WBL and WBLb are 0, then no write is performed. So this cell can perform Selective Write function with WBL=WBLb=0, with WE=1.

When doing a Selective Write, it is often desired to write data "1" on some cells and data "0" to other cells on the same bit line. For the 3-port XOR cell illustrated in FIG. 1, this can be accomplished by taking 2 cycles to write data in which data "1" is written in one cycle and data "0" is written in the other cycle.

FIGS. 4 and 5 illustrate a full adder truth table for a full adder that may be implemented using the processing array with complementary XOR cells shown in FIG. 2. Ain and Bin are 2 full adder inputs and Cin is the carry input. Bout is the Sum output and Cout is the carry output. Cinb is the invert of Cin and Coutb is the invert of Cout. As shown in the truth table, two or more of the three inputs (Ain, Bin and Cin) being a logic "1" will generate Cout as a logic "1" and an odd number of three inputs being a logic "1" (one of the inputs being "1" or three of the inputs being "1") will generate Bout as a logic "1".

Using the processing array 200 and the cell 100 described above, the 3 inputs of the full adder may be stored in three cells along the same bit line and thus the processing array may generate sum and carry outputs in 2 cells after the logic operation. In this example implementation, the cell that stores the Bin input is shared as Sum output, Bout, and the cell that stores Cin cell may be shared as Carry output Cout. The processing array may further generate the Coutb and Cinb signals shown in the truth table since these are just inverted signals of Cout and Cin.

In states 1, 3, 6 and 8 shown in FIG. 4, Bout=Bin and Coutb=Cinb. This means there is nothing needed to be done in the computation if the inputs are the 4 combinations of values shown in states 1, 3, 6 and 8 and the processing array will be able to generate the outputs without any logic operation. The subset of the states (2, 4, 5 and 7) where outputs are not the same as inputs (known as "calculated states") as shown in FIG. 5. As shown in FIG. 5, in all calculated states, Ain and Cinb are either both 0 or both 1. In the states the outputs do not need to change, Ain and Cinb are in different values. Therefore, the circuitry in the BL read write logic 204 may perform an operation that is XNOR (Ain, Cinb)=1, then the outputs of the full adder need to change. FIG. 5 also shows that Bout has the same value as Coutb for all of the calculated states and that value for Bout and Coutb is the invert of Bin. Therefore, the circuitry in the BL read write logic 204 may perform an operation that If XNOR (Ain, Cinb)=1, then Bout=Cinb=NOT (Bin); and if XNOR (Ain, Cinb)=0, Bout and Cinb do not change.

Figure 6:
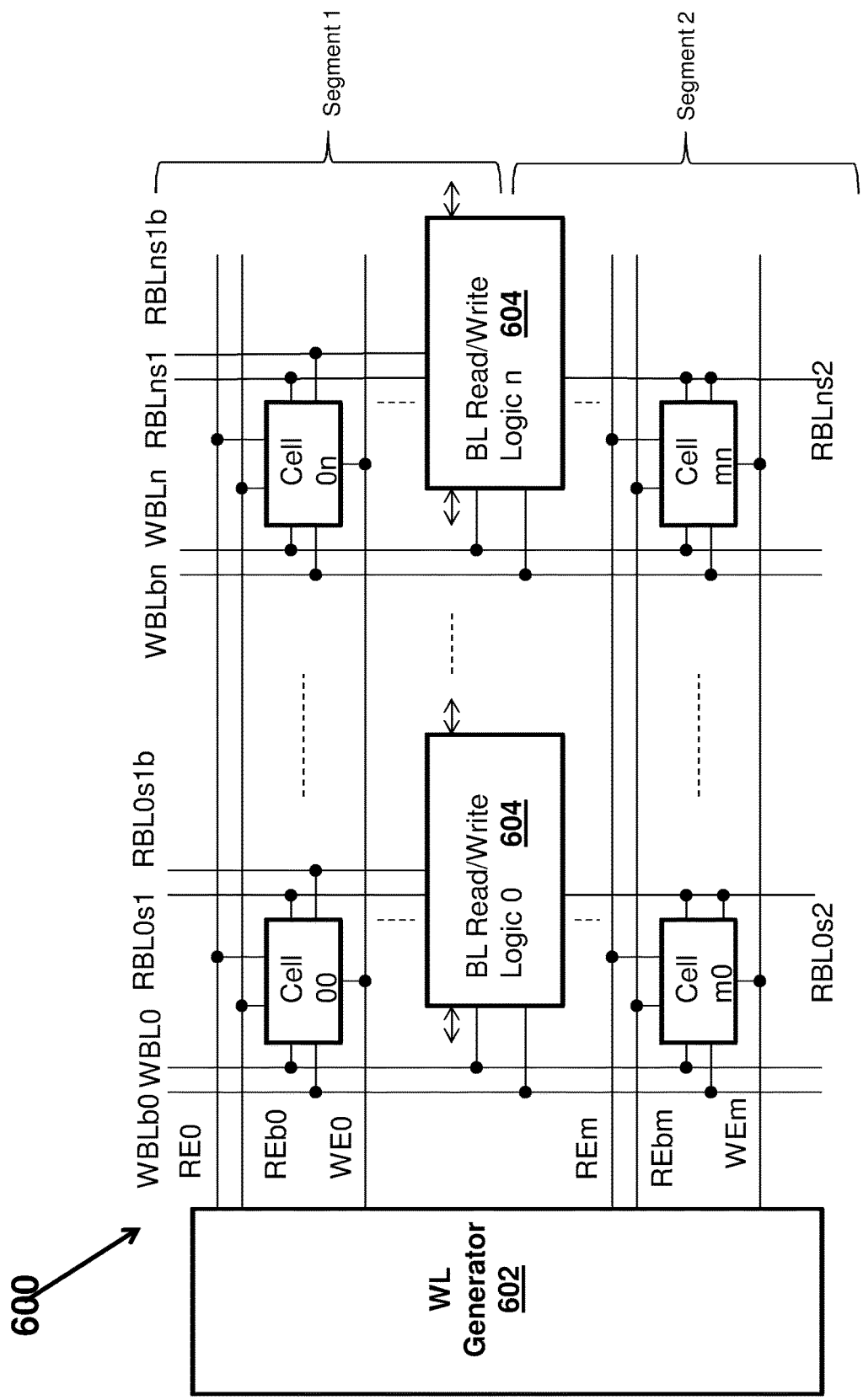
FIG. 6 illustrates an implementation of a second embodiment of a processing array that has a plurality of the complementary XOR cells shown in FIG. 1 and split segments.

FIG. 6 illustrates an implementation of a second embodiment of a processing array 600 that has a plurality of the complementary XOR cells shown in FIG. 1 and split segments and each of the bit line (BL) read/write logic circuitry 604 in the middle of the bit line. This processing array has the same word line generator 602 that generates control signals (RE0, . . . , Rem, Reb0, . . . , REbm and WE0, . . . , WEm) and operate the same way as described above in connection with FIG. 2. In this implementation, each bit line has two segments. Segment 1 has RBLs1 and RBLs1b read bit lines (RBL0s1, . . . , RBLns1 and RBL0s1b, . . . , RBLns1b) with number of cells connected on it (cell 00, . . . , cell 0n in the example in FIG. 6) which are all connected to the BL read/write circuitry 604. Segment 2 has only RBLs2 lines (RBL0s2, . . . , RBLns2) with a number of cells (cell m0, . . . , cell mn in the example in FIG. 6) which are all connected to another input of the BL read/write circuitry 604. For description purpose, RBLb in segment 2 is hard wired to RBL. As discussed earlier, RBLb in segment 2 can also be connected to RBL through transistors. In this example, WBL and WBLb are shared between the 2 segments. To do a 16-bit Adder, for example, we need to have 16 bits of Ain and Bin inputs and 1 bit to store Cin/Cout. Then RBLs2 in this configuration may have 16 or more cells on it for Bin, and RBLs1 may have 17 or more cells with 16 cells for Ain plus 1 extra cells for Cin. As shown in FIG. 6, each BL Read/Write Logic 604 has 3 inputs from RBLs (RBL0s1, RBL0s1b and RBL0s2 for example) which can perform a Full Adder operation in one cycle with 3 inputs in many different implementations. Six non-limiting examples of the circuitry of the BL read/write circuitry 604 in FIG. 6 that perform the full adder operation and/or search operation in one clock cycle are shown in FIGS. 7-12.

Figure 7:
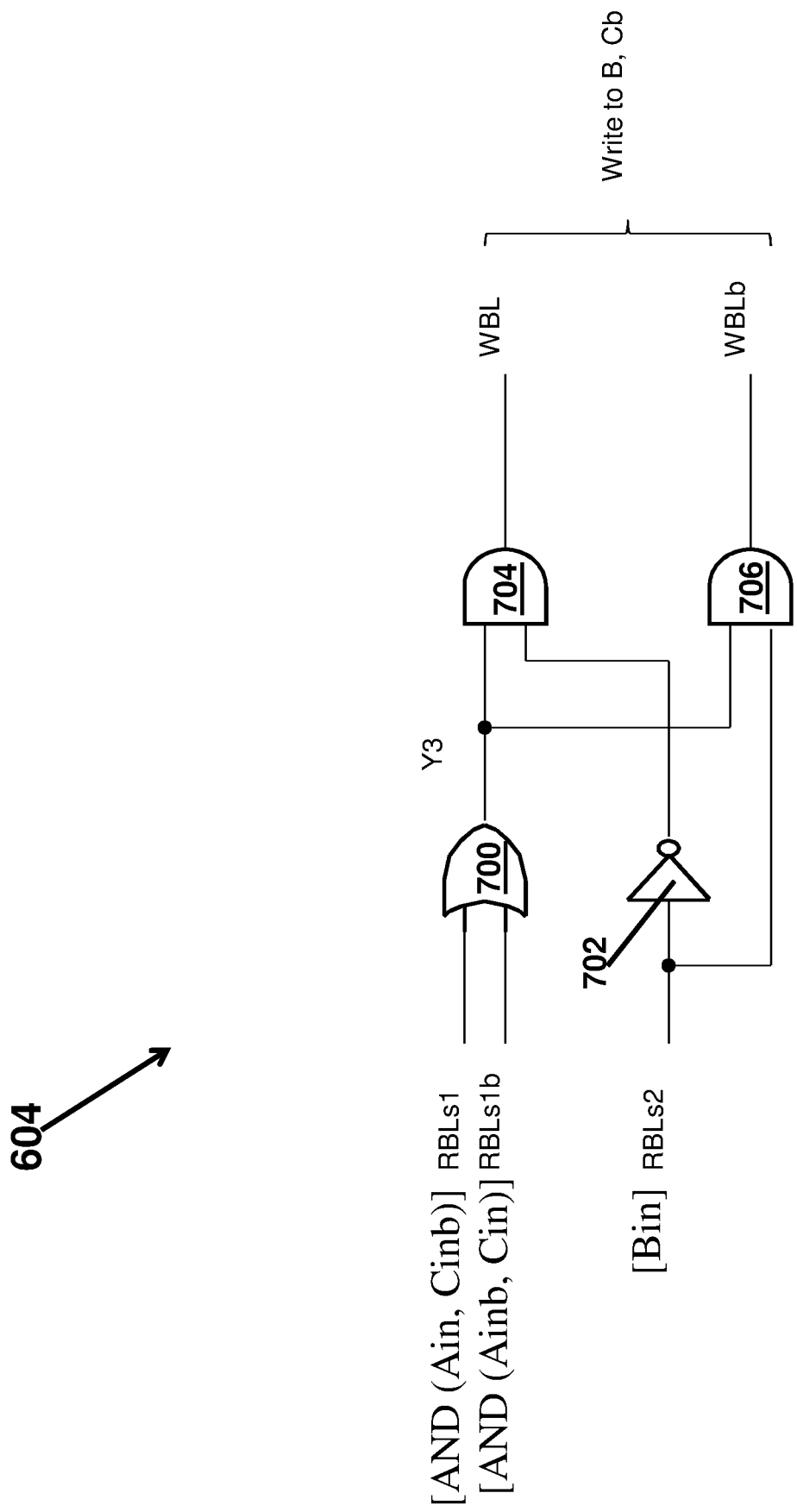
FIG. 7 illustrates an implementation of a first embodiment of the bit line read/write logic for the processing array shown in FIG. 6.

FIG. 7 illustrates an implementation of a first embodiment of the BL Read/Write Logic 604 for the processing array shown in FIG. 6. In this implementation, Ain and Cinb are stored in the cells in segment 1 along the same bit line and Bin is stored in segment 2. During a read operation, the cells' statuses are as below:

1. Both RE and REb of Ain and Cinb cells are 1 when read resulting in:

a. $RBLs1 = AND(Ain, Cinb)$ (EQ8)

b. $RBLs1b = AND(Ainb, Cin)$ (EQ9)

2. RE of Bin cell is 1 and REb of Bin cell is 0 when read resulting in:

a. $RBLs2 = Bin$ (EQ10)

An OR gate 700 as described in EQ7 and from EQ 7-9, it can be expressed as $Y3 = OR(RBLs1, RBLs1b) = OR(AND(Ain, Cinb), AND(Ainb, Cin)) = XNOR(Ain, Cinb)$ (EQ11)

The BL Read/Write Logic 604 may further comprise an inverter 702 whose input is connected to the Bin signal (the RBLs2 line) and whose output (an inverted Bin signal) is connected to an input of a first AND gate 704. The AND gate 704 other input is connected to the Y3 signal. The BL Read/Write Logic 604 may further comprise a second AND gate 706 whose inputs are connected to the Bin signal and the Y3 signal. The outputs of the two AND gates are the WBL signal and the WBLb signal.

Based on the above logic in FIG. 7:

If $Y3=1$, then $Bout = Coutb = NOT(Bin)$ (EQ12)

If $Y3=0$, $Bout$ and $Coutb$ do not change (EQ13)

In this implementation, Bin and Cinb need to do a selective write and are written to be NOT(Bin) if Y3=1. There is no write operation if Y3=0. After the selective write, Bin and Cinb turn into Bout and Coutb, respectively:

$WBL = AND(Y3, NOT(Bin))$ (EQ14)

$WBLb = AND(Y3, Bin)$ (EQ15)

WE of $Bin$ and $Cinb$ is 1 during write. (EQ16)

Using the above BL Read/Write Logic in FIG. 7, the full adder operation may be performed in a single clock cycle and have the calculated states as shown in FIG. 5. In a single clock cycle, RE maybe a pulse in the first half of the clock cycle to generate WBL and WBLb, WE maybe another non-overlap pulse of RE in the second half of the clock cycle to perform the writing to the Bout and Coutb cells.

FIG. 7 demonstrates the full adder circuit by storing Ain and Cinb on segment 1 and storing Bin on segment 2. Alternatively, a small modification to the circuit in FIG. 7 can do the full adder circuit by storing Ain and Cin on segment 1 and storing Bin on segment 2. The OR gate 700 maybe changed to NOR gate so Y3 is still defined by EQ11. WBL and WBLb of segment 1 and segment 2 need to be connected to BL Read/Write Logic 604 separately. WBL and WBLb of segment 2 connected to AND gate 704 and 706 respectively, for the writing of Bout value. WBL and WBLb of segment 1 connected to AND gate 706 and 704 respectively, for the writing of Cout value. The implementations discussed below are also demonstrated with Ain, Cinb and Bin stored in the processing array, but other combinations of storing different polarity of inputs can be simply implemented by the persons with the skill of the art.

Figure 8:
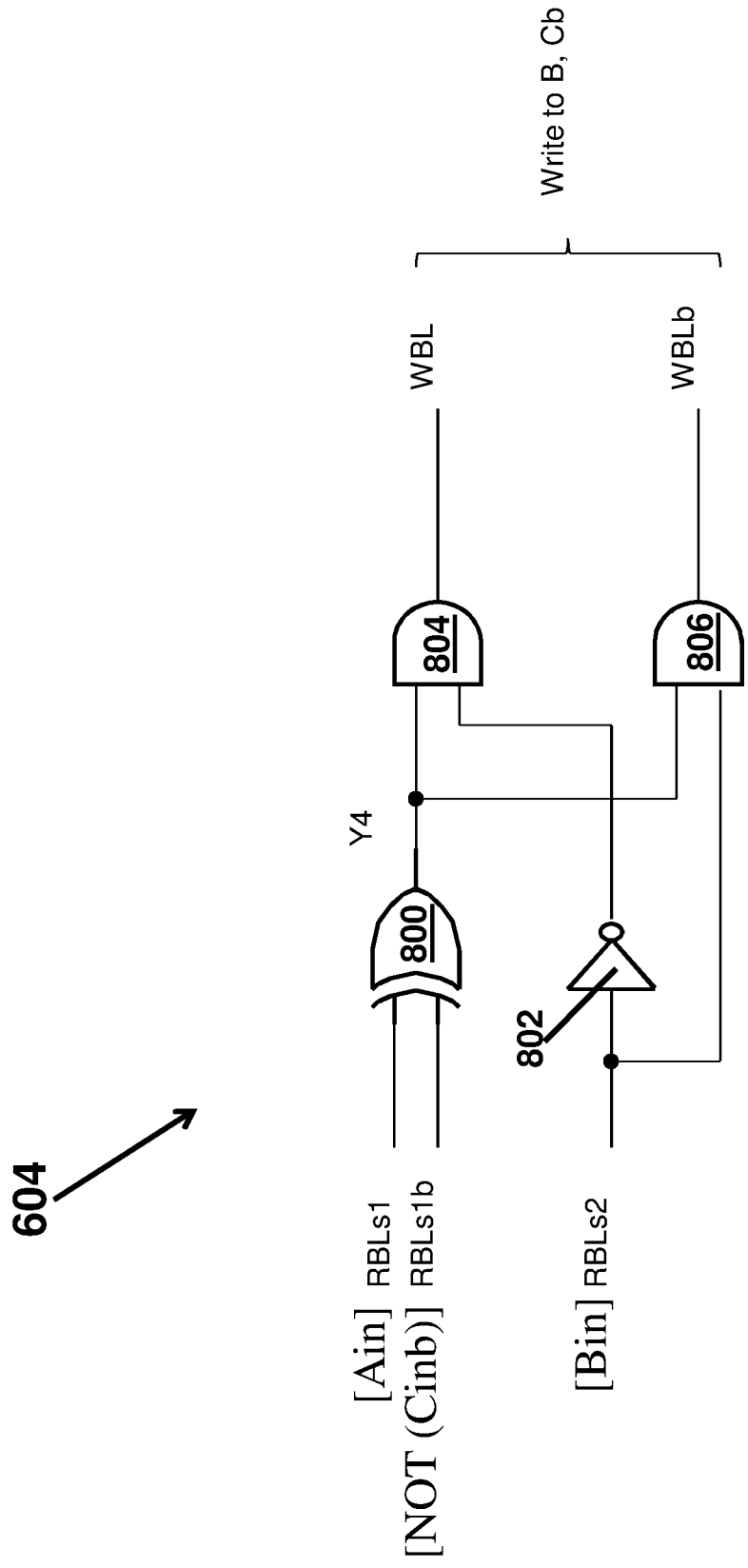
FIG. 8 illustrates an implementation of a second embodiment of the bit line read/write logic for the processing array shown in FIG. 6.

FIG. 8 illustrates an implementation of a second embodiment of the BL Read/Write Logic 604 for the processing array shown in FIG. 6. In this implementation, Ain and Cinb are stored in the cells in segment 1 along the same bit line. Bin is stored in segment 2. In a read operation, the cells' statuses are as below:

1. For Ain, RE=1, REb=0 when read. For Cinb, RE=0, REb=1 when read. So a. $RBLs1 = Ain$ (EQ17)

b. $RBLs1b = NOT(Cinb)$ (EQ18)

2. RE of Bin is 1 and REb of Bin is 0 when read.

a. $RBLs2 = Bin$ (EQ19)

Y4 is the XOR function (by an XOR logic gate 800) of RBLs1 and RBLs1b, so $Y4 = XOR(RBLs1, RBLs1b) = XOR(Ain, NOT(Cinb)) = XNOR(Ain, Cinb)$ (EQ20)

EQ20 is showing the same result as EQ12, which result in Y3=Y4, And therefore WBL and WBLb of FIG. 8 has the result of FIG. 7 as described above and has the same inverter 802 and two AND gates 804, 806 that perform in the same manner as described above. Therefore, full adder operation is performed in FIG. 8.

The implementation of the circuitry 604 in FIG. 8 can also combine an additional input to the full adder. For example, it may be desirable to have the full adder has an input such as X, Bin and Cin wherein X is a AND function of Ain and W. Ain and W may be 2 values stored on 2 cells along the same RBL, RBLs1, and X is formed as shown on EQ1 by turning on the read word line (RE) of both cells storing Ain and W. This function is particularly useful when doing Multiplier circuit when the basic cell is a full adder with multiplicand an AND function of 2 inputs. One method to implement is to store W as in an additional cell in segment 1 along the same bit line as Ain and Cinb. Then in the read operation, the cells' statuses are as below:

1. For Ain and W, RE=1, REb=0 when read. For Cinb, RE=0, REb=1 when read. So a. $RBLs1 = AND(Ain, W) = X$  (EQ21)

b. $RBLs1b = NOT(Cinb)$  (EQ22)

2. RE of Bin is 1 and REb of Bin is 0 when read.

a. $RBLs2 = Bin$  (EQ23)

Y4 is the XOR function of RBLs1 and RBLs1b, so $Y4 = XOR(RBLs1, RBLs1b) = XOR(X, NOT(Cinb0)) = XNOR(X, Cinb)$  (EQ24)

EQ24 is showing the same result as EQ20, but with additional AND function as Full Adder input. Another method is to use the signal W as a read word line of Ain's cell. In the read operation, the cells' statuses are as below:

1. For Ain, RE=0, REb=W when read. For Cinb, RE=1, REb=0 when read. So a. $RBLs1 = Cinb$  (EQ25)

b. $RBLs1b = NAND(W, Ain) = NOT(X)$  (EQ26)

2. RE of Bin is 1 and REb of Bin is 0 when read.

a. $RBLs2 = Bin$  (EQ27)

Y4 is the XOR function of RBLs1 and RBLs1b, so $Y4 = XOR(RBLs1, RBLs1b) = XOR(Cinb, NOT(X)) = XNOR(X, Cinb)$  (EQ28)

EQ28 is showing the same result as EQ20 with additional AND function as Full Adder input.

As mentioned in EQ4, the AND function of RBLs1 and RBLs1b generates the below equation:

$Y1 = AND(XNOR(RE1, D1), XNOR(RE2, D2), \ldots, XNOR(REn, Dn))$  (EQ4)

Where REi, REbi, i=1 to n, as complementary signals; REi=1 means REi=1, REbi=0; REi=0 means REi=0, REbi=1. Di is the data stored in the cell i with read word lines REi. Y1 is also the compare result of RE1 to REn vs. D1 to Dn. If RE1 to REn as search key matches with D1 to Dn, then Y1=1. If any of RE1 to REn is not matched with the corresponding D1 to Dn, then Y1=0.

Similarly, RBLs2 is wired AND function of RBLs2 and RBLs2b, RBLs2 is the compare result of active REi and REib of RBLs2.

Figure 9:
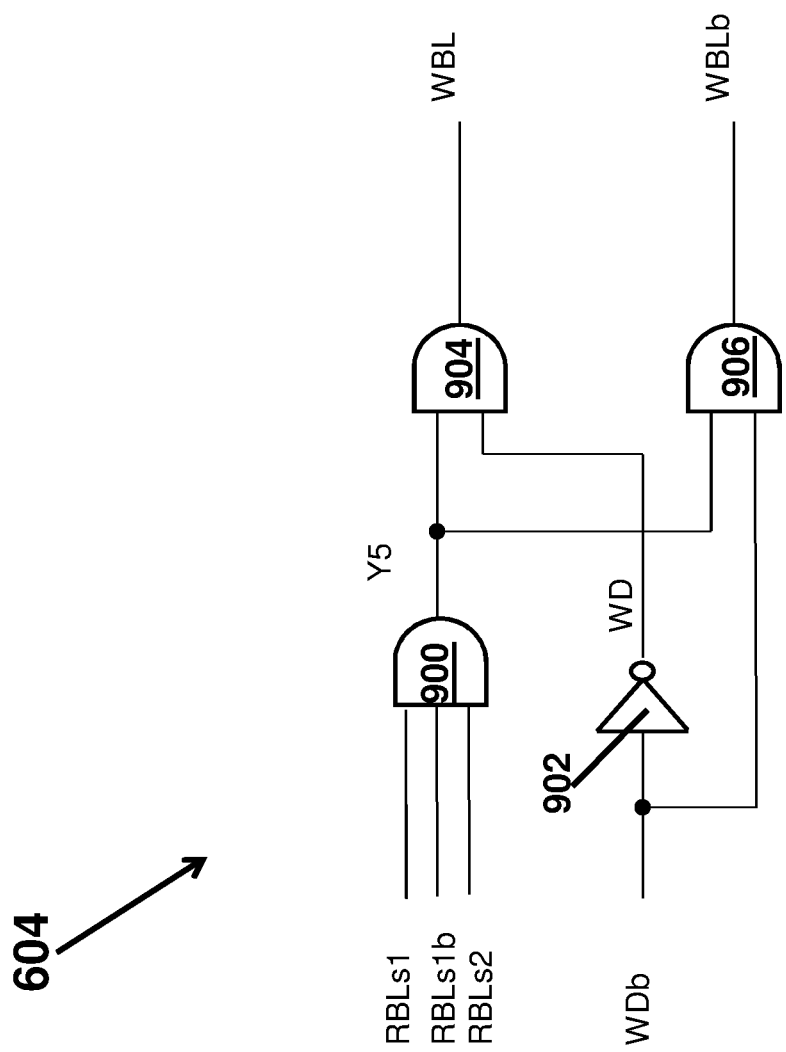
FIG. 9 illustrates an implementation of a third embodiment of the bit line read/write logic for the processing array shown in FIG. 6.

FIG. 9 illustrates an implementation of a third embodiment of the BL Read/Write Logic 604 for the processing array shown in FIG. 6. In FIG. 9, the OR logic gate 700 in FIG. 7 or the XOR logic gate 800 in FIG. 8 is replaced by an AND logic gate 900 whose inputs are the RBLs1, RBLs1b and RBLs2 lines. In FIG. 9, the signal Y5 is shown as below:

$Y5 = AND(RBLs1, RBLs1b, RBLs2)$  (EQ29)

Y5 is a compare result of both RBL segment 1 and RBL segment 2. If the search key is comprised of read word lines in both segment 1 and segment 2, then Y5 yields the combined result. If the search key is comprised of only RE and REb of segment 1, and none of RE and REb of segment 2 is active, then RBLs2 stays as 1 because it is pre-charged 1 and Y5 yields the compare result of segment 1. Similarly, if the search key is comprised of only RE and REb of segment 2, and none of RE and REb of segment 1 is active, then RBLs1 stays as 1 because it is pre-charged 1 and Y5 yields the compare result of segment 2. In summary, Y5 yields the compare result of RE and REb turned on in both or either segment 1 or segment 2.

In FIG. 9, a WDb signal maybe a data line in parallel with REs to feed into the BL Read/Write Logic 604, or maybe fed from the neighboring BL Read/Write logic. If Y5 is 1, then WBL=NOT (WDb)=WD and WBLb=WDb to perform selective write to store WD to the cell selected by WE during write. If Y5 is 0, then no write will be performed even if selected WE is turned on. The above logic is implemented by the inverter 902 connected to the WDb signal, an AND logic gate 904 whose inputs are the Y5 signal and the WD signal and whose output is fed to the WBL line and a second AND gate 906 whose inputs are the Y5 signal and the WDb signal and whose output is fed to the WBLb line.

Figure 10:
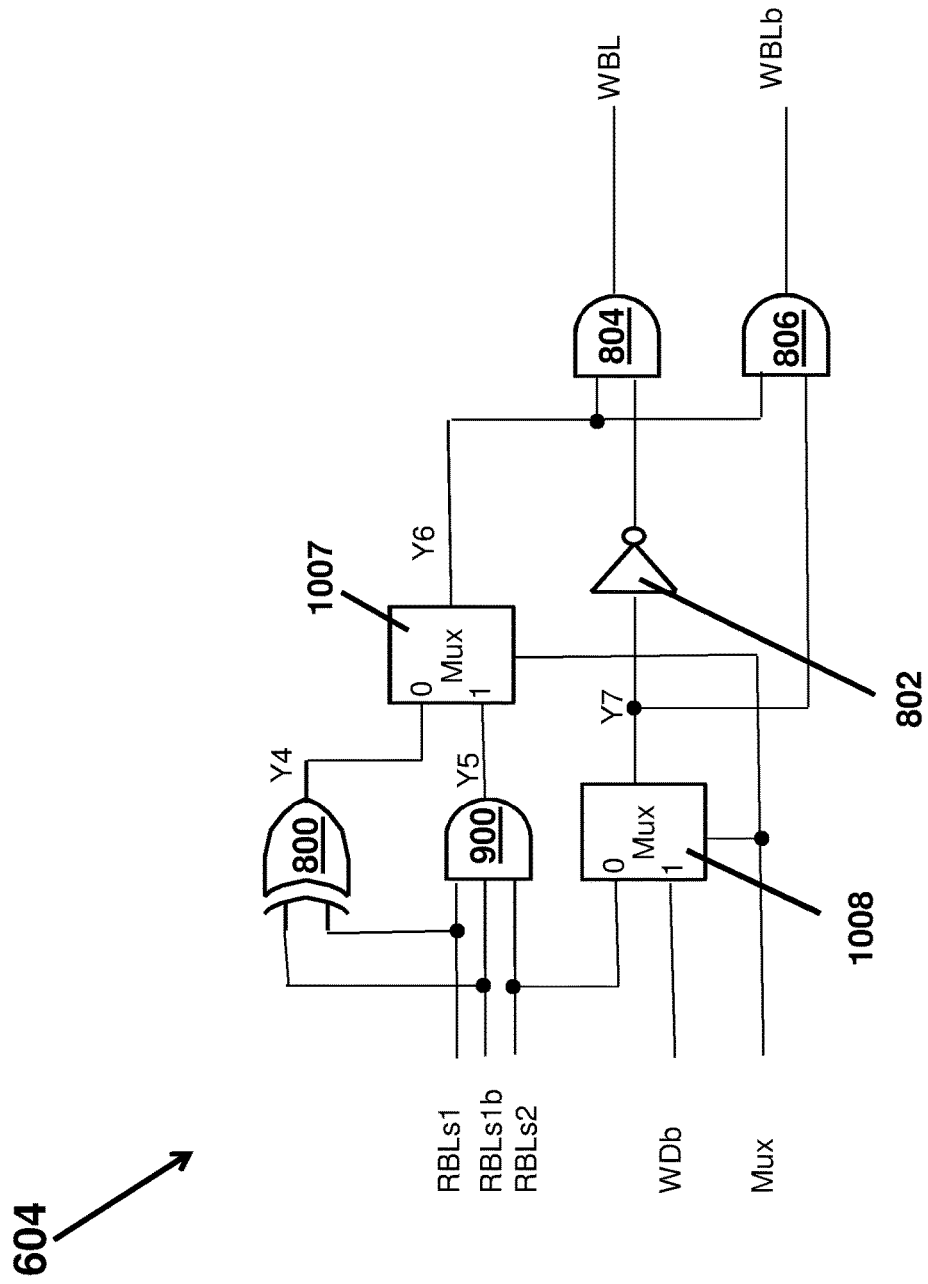
FIG. 10 illustrates an implementation of a fourth embodiment of the bit line read/write logic for the processing array shown in FIG. 6 that combines the embodiments in FIGS. 8 and 9.

FIG. 10 illustrates an implementation of a fourth embodiment of the BL Read/Write Logic 604 for the processing array shown in FIG. 6 that combines the circuits in the embodiments in FIGS. 8 and 9 and can perform a full adder operation and/or a search operation. The circuits 800, 802, 804, 806 and 900 in FIG. 10 are the same as described above. Furthermore, signal Y4 in FIG. 10 is same as Y4 in FIG. 8 as selective write control signal for full adder operation and signal Y5 in FIG. 10 is same as Y5 in FIG. 9 as selective write control signal for search operation. This BL Read/Write Logic 604 may receive a global Mux signal (Mux) in parallel with word lines that selects either the Y4 signal or Y5 signal using a 2:1 Mux 1007 to generate a Y6 signal that is a selective write control signal. A second Mux 1008 (also a 2:1 MUX) selects either RBLs2 for full adder operation or WDb for search operation to generate the Y7 signal as write data to be written in the selective write operation. In this manner, FIG. 10 is comprised of circuits to do two major operation: Full Adder and Search.

Figure 11:
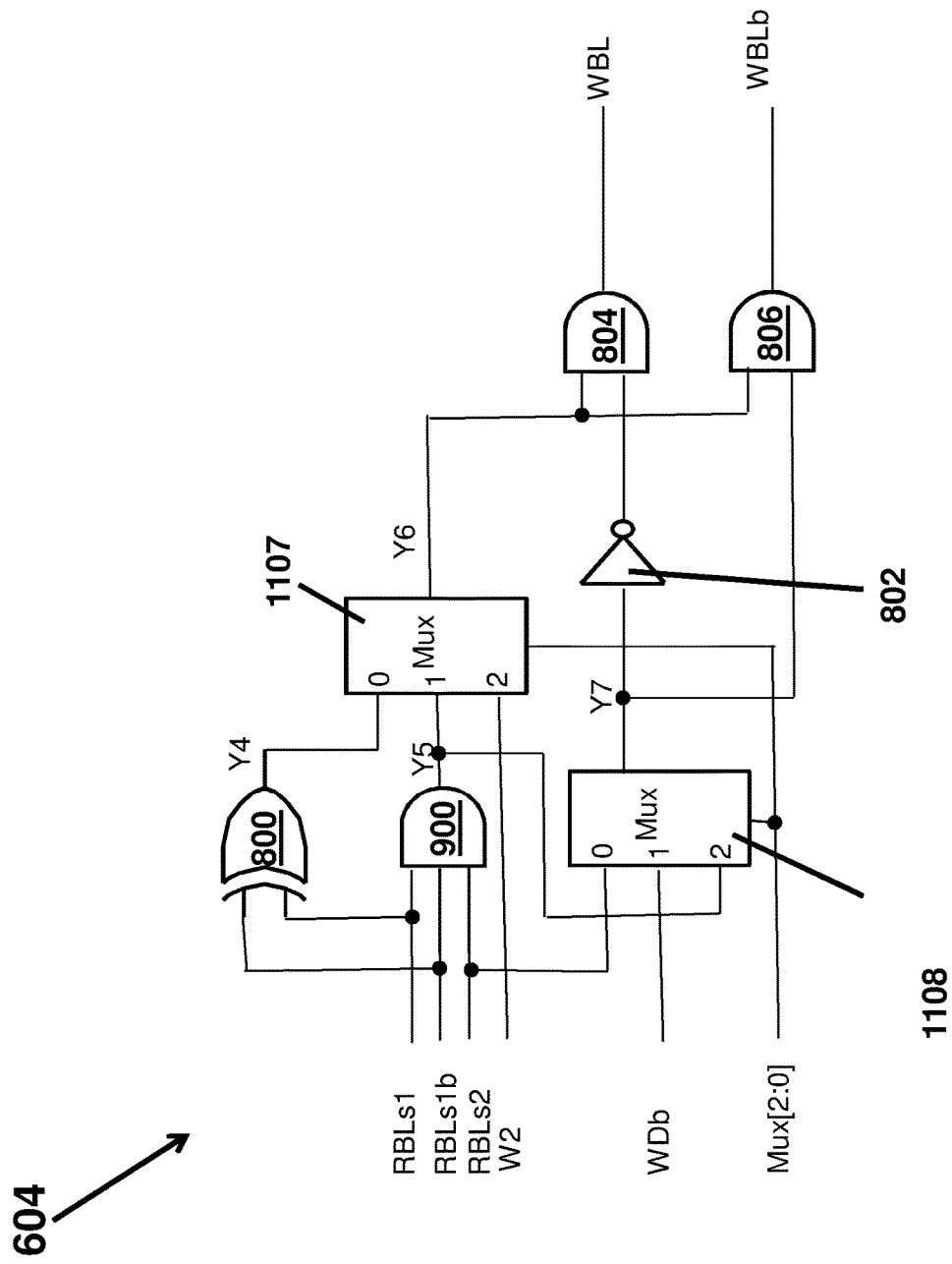
FIG. 11 illustrates an implementation of a fifth embodiment of the bit line read/write logic for the processing array shown in FIG. 6.

FIG. 11 illustrates an implementation of a fifth embodiment of the BL Read/Write Logic 604 for the processing array shown in FIG. 6 that combines the circuits in the embodiments in FIGS. 8 and 9 and can perform a fuller adder operation and/or a search operation. The circuits 800, 802, 804, 806 and 900 in FIG. 11 are the same as described above. Furthermore, signal Y4 20 in FIG. 11 is same as Y4 in FIG. 8 as selective write control signal for full adder operation and signal Y5 in FIG. 11 is same as Y5 in FIG. 9 as selective write control signal for search operation. FIG. 11 adds an extra function to the circuit shown in FIG. 10. The circuit in FIG. 11 includes a new input, W2, to the mux 1107 (now a 3:1 MUX with inputs Y4 (mux[0]), Y5 (mux[1]) and W2 (mux[2]). W2 is added as another write control signal to perform the write function on a write data mux 1108 input 2. Y5 is fed into write data mux 1108 as input 2. So if Mux [2] is selected and Mux[1]=Mux[0]=0, mux 1107 select W2 as the selective write control signal. If W2=1, WBLb=NOT (WBL), and the write data on WBL to write to the cell is shown as:

$WBL = NOT(Y7) = NOT(Y5) = NAND(RBLs1, RBLs1b, RBLs2)$  (EQ30)

If RBLs2 is not active, meaning none of RE and REb on segment 2 is selected and RBLs2 is precharged high and stays high, then EQ(30) can be shown as EQ(31) as set forth below. Similarly, if RBLslb or RBLs1 is not active, then it can be shown as EQ(32) or EQ(33) as set forth below, respectively.

$$WBL=NAND(RBLs1, RBLs1b), \text{ if } RBLs2 \text{ is not active} \quad EQ(31)$$

$$WBL=NAND(RBLs1, RBLs2), \text{ if } RBLs1b \text{ is not active} \quad EQ(32)$$

$$WBL=NAND(RBLs1b, RBLs2), \text{ if } RBLs1 \text{ is not active} \quad EQ(33)$$

Furthermore, if only one of the RBL in the above equation is active, then the equations are reduced to EQ(34) to EQ(37) as set forth below:

$$\begin{aligned} WBL &= NOT(RBLs1) \\ &= NOT(AND(D1, D2, \ldots, Dn)) \\ &= NAND(D1, D2, \ldots, Dn) \end{aligned} \quad EQ(34)$$

$D1, D2, \ldots, Dn$ are the data in the cells with $RE = 1$ when read on $RBLs1$ $$\begin{aligned} WBL &= NOT(RBLs1b) \\ &= NOT(AND(D1b, D2b, \ldots, Dnb)) \\ &= NAND(D1b, D2b, \ldots, Dnb) \\ &= OR(D1, D2, \ldots Dn) \end{aligned} \quad EQ(35)$$

$D1, D2, \ldots, Dn$ are the data in the cells with $REb = 1$ when read on $RBLs1b$ $$\begin{aligned} WBL &= NOT(RBLs2) \\ &= NOT(AND(D1, D2, \ldots, Dn)) \\ &= NAND(D1, D2, \ldots, Dn) \end{aligned} \quad EQ(36)$$

$D1, D2, \ldots, Dn$ are the data in the cells with $RE = 1$ when read on $RBLs2$ $$\begin{aligned} WBL &= NOT(RBLs2) \\ &= NOT(AND(D1b, D2b, \ldots, Dnb)) \\ &= NAND(D1b, D2b, \ldots, Dnb) \\ &= OR(D1, D2, \ldots Dn) \end{aligned} \quad EQ(37)$$

$D1, D2, \ldots, Dn$ are the data in the cells with $REb = 1$ when read on $RBLs2b$ In summary, the circuit shown in FIG. 11 may implement three basic functions as below:
1. Mux[0]: Full Adder Operation.
2. Mux[1]: Search Operation.
3. Mux[2]: Combined Boolean operation of RBLs1, RBLs1b and RBLs2.

Figure 12:
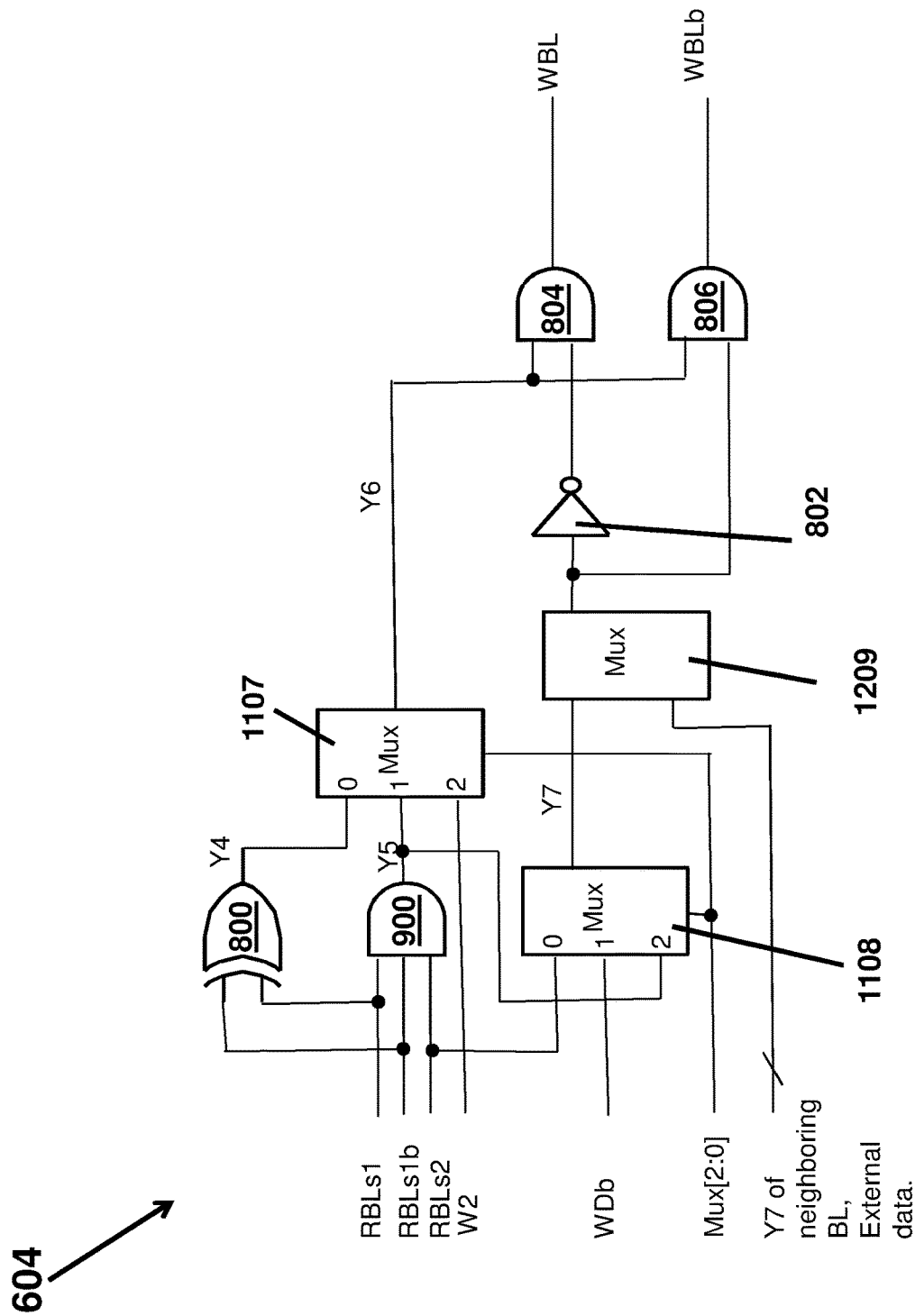
FIG. 12 illustrates an implementation of a sixth embodiment of the bit line read/write logic for the processing array shown in FIG. 6.

FIG. 12 illustrates an implementation of a sixth embodiment of the BL Read/Write Logic 604 for the processing array shown in FIG. 6 that has the same circuits 800-806, 900, 1107 and 1108 described above for FIGS. 8, 9 and 11 that perform the same functions. Similarly, the Y4, Y5, Y6 and Y7 signals are the same as those described above for FIG. 11. In this embodiment, the Y7 of a neighboring bit line of the processing array may be fed into a data mux 1209 as additional data input for a shift operation. Y7 of the neighboring bit line, data external to the processing array can also be fed into the data mux 1209 as addition input to transfer external data into processing array. The write data mux 1209 multiplexes the data of the neighboring BL Read/Write Logic and the external data into the processing array to be written into WBL and WBLb.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include and/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that perform particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. A memory computation cell, comprising:
a storage cell storing data and complementary data;
two read bit lines connected to the storage cell that provide read access to the data and complementary data of the storage cell; and
an isolation circuit connected between the two read bit lines and the storage cell that buffers the storage cell from a signal on either of the two read bit lines, the isolation circuit connected to a read word line and a complementary read word line, wherein each read bit line of the two read bit lines is configured to perform a logic function when the memory computation cell is connected by the same read bit line with another memory computation cell and two logic functions are performed on the two read bit lines.

2. The memory computation cell of claim 1 further comprising a write bit line connected to the memory computation cell wherein data is written into the storage cell using the write bit line.

3. The memory computation cell of claim 2 further comprising a write port device that buffers the storage cell from the write bit line.

4. The memory computation cell of claim 2 that is configured to perform a selective write operation.

5. The memory computation cell of claim 1, wherein the memory computation cell is a static random access memory cell.

6. The memory computation cell of claim 5, wherein the static random access memory cell is a three port static random access memory cell.

7. The memory computation cell of claim 5, wherein the storage cell further comprises a first inverter and a second inverter that the cross coupled to the first inverter.

8. The memory computation cell of claim 1, wherein the memory computation cell is a non-volatile memory.

9. The memory computation cell of claim 8, wherein the non-volatile memory is one of a non-volatile memory cell and a non-volatile memory device.

10. The memory computation cell of claim 1, wherein the isolation circuit further comprises a first set of transistors connected between a complementary read bit line of the two read bit lines and a data storage point of the storage cell.

11. The memory computation cell of claim 10, wherein the first set of transistors further comprises a first transistor whose gate is connected to a complementary read word line and a second transistor whose gate is connected to the data storage point of the storage cell.

12. The memory computation cell of claim 10, wherein the isolation circuit further comprises a second set of transistors connected between a read bit line of the two read bit lines and a complementary data storage point of the storage cell.

13. The memory computation cell of claim 12, wherein the second set of transistors further comprises a third transistor whose gate is connected to a read word line and a fourth transistor whose gate is connected to the complementary data storage point of the storage cell.

14. A processing array, comprising:
a plurality of read bit lines;
an array of memory cells having a plurality of rows of memory cells and a plurality of columns of memory cells, each memory cell having a storage cell, the read bit lines connecting to the columns of memory cells in the memory cell array;
the array of memory cells having a first segment comprising at least two rows of memory cells and a second segment comprising one of the plurality of rows of memory cells, the first segment having each column of memory cells connected to at least two of the plurality of read bit lines and the second segment having each column of memory cells connected to at least one read bit line of the plurality of read bit lines; and
a plurality of bit line read/write circuits positioned between the first segment and the second segment in the array of memory cells, each bit line read/write circuit having inputs from the at least two read bit lines of the first segment and an input from the at least one read bit line of the second segment, wherein each read bit line connected to the memory cells in the first segment is configured to perform a logic function when at least one memory cell is connected to the same read bit line as another memory cell and two logic functions are performed on the two read bit lines in the first segment.

15. The processing array of claim 14, wherein a first input and a carry input of a full adder are stored along the same read bit line of the first segment and wherein a second input of a full adder is stored along the same read bit line of the second segment.

16. The processing array of claim 15, wherein the first input is a signal and the carry input is an inverted signal and the second input is a signal.

17. The processing array of claim 16, wherein each bit line read/write circuit further comprises an OR gate that logically ORs the at least two read bit lines of the first segment and generates an output, an inverter that inverts the second input of the full adder to generate an inverted second input, a first AND gate that logically ANDs the output of the OR gate and the inverted second input to generate a first output and a second AND gate that logically ANDs the output of the OR gate and the second input of the full adder to generate a second output.

18. The processing array of claim 17 further comprising a plurality of write bit lines wherein each write bit line is connected to a selected column of memory cells and the bit line read/write circuit connected to the selected column of memory cells and a plurality of complement write bit lines wherein each complement write bit line is connected to the selected column of memory cells and the bit line read/write circuit connected to the selected column of memory cells.

19. The processing array of claim 18, wherein the first output is connected to the write bit line connected to the bit line read/write circuit and the second output is connected to the complement write bit line connected to the bit line read/write circuit.

20. The processing array of claim 17, wherein the at least two read bit lines of the first segment further comprises a first read bit line and a second read bit line, the first read bit line carrying a signal corresponding to a logical AND of the first input of the full adder and the inverted carry input of the full adder and the second read bit line carrying a signal corresponding to a logical AND of an inverted first input of the full adder and a carry input of the full adder.

21. The processing array of claim 16, wherein each bit line read/write circuit further comprises an XOR gate that logically XORs the at least two read bit lines of the first segment and generates an output, an inverter that inverts the second input of the full adder, a first AND gate that logically ANDs the output of the XOR gate and the inverted second input of the full adder to generate a first output and a second AND gate that logically ANDs the output of the XOR gate and the second input of the full adder to generate a second output.

22. The processing array of claim 21 further comprising a plurality of write bit lines wherein each write bit line is connected to a selected column of memory cells and the bit line read/write circuit connected to the selected column of memory cells and a plurality of complement write bit lines wherein each complement write bit line is connected to the selected column of memory cells and the bit line read/write circuit connected to the selected column of memory cells.

23. The processing array of claim 22, wherein the first output is connected to the write bit line connected to the bit line read/write circuit and the second output is connected to the complement write bit line connected to the bit line read/write circuit.

24. The processing array of claim 21, wherein the at least two read bit lines of the first segment further comprises a first read bit line and a second read bit line, the first read bit line carrying a signal corresponding to the first input of the full adder and the second read bit line carrying a signal corresponding to a logical NOT of the inverted carry input of the full adder.

25. The processing array of claim 16, wherein each bit line read/write circuit further comprises an AND gate that logically ANDs the at least two read bit lines of the first segment and the read bit line of the second segment and generates an output, an inverter that inverts a write data signal, a second AND gate that logically ANDs the output of the AND gate and the inverted write data signal to generate a first output and a third AND gate that logically ANDs the output of the AND gate and the write data signal to generate a second output.

26. The processing array of claim 25, wherein the search operation is performed on the first segment and the second segment.

27. The processing array of claim 25, wherein the first output is connected to a write bit line connected to the bit line read/write circuit and the second output is connected to a complementary write bit line connected to the bit line read/write circuit.

28. The processing array of claim 16, wherein each bit line read/write circuit further comprises a logic gate that generates a selective write control signal for a full adder operation, a logic gate that generates a selective write control signal for a search operation, a first multiplexer that selects one of the selective write control signal for the full adder operation and the selective write control signal for the search operation and a second multiplexer that generates write data for the selective write operation.

29. The processing array of claim 16, wherein each bit line read/write circuit further comprises a logic gate that generates a selective write control signal for a full adder operation, a logic gate that generates a selective write control signal for a search operation, a first multiplexer that selects one of the selective write control signal for the full adder operation, the selective write control signal for the search operation and a write data control signal and a second multiplexer that generates write data for the selective write operation.

30. The processing array of claim 16, wherein each bit line read/write circuit further comprises a logic gate that generates a selective write control signal for a full adder operation, a logic gate that generates a selective write control signal for a search operation, a first multiplexer that selects one of the selective write control signal for the full adder operation, the selective write control signal for the search operation and a write data control signal, a second multiplexer that generates write data for the selective write operation and a third multiplexer that selects one of the generated write data from the second multiplexer and a write data signal generated from the combined Boolean operation of the two read bit lines from the first segment and the read bit line from the second segment and a write data signal external to the processing array.

* * * * *